United States Patent
Iaculo et al.

(10) Patent No.: US 7,603,593 B2
(45) Date of Patent: Oct. 13, 2009

(54) METHOD FOR MANAGING BAD MEMORY BLOCKS IN A NONVOLATILE-MEMORY DEVICE, AND NONVOLATILE-MEMORY DEVICE IMPLEMENTING THE MANAGEMENT METHOD

(76) Inventors: Massimo Iaculo, Via Luxembourg, 29, San Marco Evangelista (IT) 81020; Nicola Guida, Via Nuova Trecase, 138, Torre Del Greco (IT) 80059; Andrea Ruggiero, Via Risorgimento, 28, Santi Cosma E Damiano (IT) 04020

( * ) Notice: Subject to any disclaimer, the term of this patent is extended or adjusted under 35 U.S.C. 154(b) by 82 days.

(21) Appl. No.: 12/033,855

(22) Filed: Feb. 19, 2008

(65) Prior Publication Data

US 2008/0158962 A1 Jul. 3, 2008

Related U.S. Application Data

(63) Continuation of application No. 11/152,675, filed on Jun. 14, 2005, now abandoned.

(30) Foreign Application Priority Data

Jun. 14, 2004 (EP) ................................. 04425435

(51) Int. Cl.
*G11C 29/00* (2006.01)
(52) U.S. Cl. .................... 714/710; 714/711; 714/718
(58) Field of Classification Search .................. 714/710, 714/711, 718
See application file for complete search history.

(56) References Cited

U.S. PATENT DOCUMENTS

| | | | |
|---|---|---|---|
| 4,827,452 A | 5/1989 | Toyama et al. |
| 5,781,717 A | 7/1998 | Wu et al. |
| 6,567,950 B1 | 5/2003 | Bertin et al. |

FOREIGN PATENT DOCUMENTS

| | | |
|---|---|---|
| EP | 000424889 A2 | 5/1991 |
| GB | 2 136 992 A | 9/1984 |
| WO | WO 92/20068 A1 | 11/1992 |

OTHER PUBLICATIONS

European Search Report from European Patent Application No. 04425435.7, filed Jun. 14, 2004.

*Primary Examiner*—John J Tabone, Jr.
(74) *Attorney, Agent, or Firm*—Schwabe Williamson & Wyatt

(57) ABSTRACT

A method for managing bad memory blocks of a nonvolatile-memory device, in which the available memory blocks are divided into a first set, formed by addressable memory blocks that are to be used by a user, and a second set, formed by spare memory blocks that are to replace bad addressable memory blocks, and in which the bad addressable memory blocks are re-mapped into corresponding spare memory blocks. The re-mapping of the bad addressable memory blocks envisages: seeking bad spare memory blocks; storing the logic address of each bad spare memory block in a re-directing vector in a position corresponding to that of the bad spare memory block in the respective set; seeking bad addressable memory blocks; and storing the logic address of each bad addressable memory block in a free position in the re-directing vector.

20 Claims, 5 Drawing Sheets

METHOD FOR MANAGING BAD MEMORY BLOCKS IN A NONVOLATILE-MEMORY DEVICE, AND NONVOLATILE-MEMORY DEVICE IMPLEMENTING THE MANAGEMENT METHOD

RELATED APPLICATION

This application is a continuation of prior application Ser. No.: 11/152,675, filed on Jun. 14, 2005, entitled METHOD FOR MANAGING BAD MEMORY BLOCKS IN A NON-VOLATILE MEMORY DEVICE, AND NONVOLATILE MEMORY DEVICE IMPLEMENTING THE MANAGEMENT METHOD, which application is incorporated herein by reference in its entirety.

BACKGROUND OF THE INVENTION

1. Field of the Invention

The present invention relates to a method for managing bad memory blocks in a nonvolatile-memory device, and to a nonvolatile-memory device implementing the management method.

2. Discussion of Related Art

As is known, nonvolatile-memory devices having an architecture of a NAND type have a memory array divided into memory blocks, each of which is in turn divided into sub-blocks referred to as pages. Each page is formed by a given number of bytes, the majority of which, approximately 95%, define the so-called data area, while the remaining bytes define an area reserved to the storage of given information ("page spare area").

Nonvolatile-memory devices having an architecture of a NAND type can be divided into two major categories according to the number of bad memory blocks that they contain: the first category comprises so-called good nonvolatile-memory devices, which do not contain bad memory blocks, while the second category includes so-called "mostly good" storage devices, which contain a number of bad memory blocks lower than a given threshold.

For the purpose of guaranteeing the execution of a minimum number of write and erase cycles during the life of the storage device, typically one hundred thousand, the nonvolatile-memory devices having an architecture of a NAND type shall not intrinsically contain, when they have just been produced, a number of bad memory blocks higher than a given threshold, typically in the region of 2% of the available memory blocks.

In response to the continuous market requirements, some manufacturers of nonvolatile-memory devices guarantee the execution of a number of write and erase cycles that is decidedly greater than one hundred thousand during the life of the storage device, typically three hundred thousand, so that it is necessary for the number of bad memory blocks that will inevitably be created during the further two hundred thousand write and erase cycles not to be higher than another threshold, typically in the region of 1.8% of the non-bad memory blocks after the first one hundred thousand cycles.

To manage the presence of bad memory blocks, it is known practice to provide, in nonvolatile-memory devices, a certain number of spare memory blocks, in which the bad memory blocks are re-mapped.

For example, in a 512-Mbit flash memory device, with 4096 memory blocks, each formed by 32 pages of 528 bytes each, of which 512 defining the data area and the remaining 16 defining the reserved area, it is necessary to provide a number of spare memory blocks equal to 153, of which 82 have the function of guaranteeing reaching the first one hundred thousand write and erase cycles, and the other 71 have the function of guaranteeing reaching three hundred thousand write and erase cycles.

The management of the bad memory blocks is performed by some manufacturers of nonvolatile-memory devices by dividing the memory array into two physically distinct areas, one reserved to the users (user-block area—UBA), and one reserved to re-mapping of bad memory blocks present in the UBA (reserved-block area—RBA).

In particular, re-mapping of bad memory blocks into spare memory blocks is performed by first constructing a re-directing table, which, for each bad memory block, stores the address of the bad memory block and the address of the corresponding spare memory block, and then re-directing any request for access to said bad memory blocks to the corresponding spare memory blocks.

The re-directing table is then stored permanently in the area of memory reserved to the users and is read whenever the user requests access to a memory block. It is then verified whether the address of the memory block to which access is requested is contained in the re-directing table and, if it is, the address of the spare memory block in which said bad memory block has been re-mapped is read, and the access is then re-directed towards said spare memory block.

Generally, however, the re-directing table involves a rather high occupation of memory, so that its storage typically entails a considerable reduction in the amount of memory actually available to users.

SUMMARY OF THE INVENTION

One aim of the present invention is to provide a method for managing bad memory blocks in a nonvolatile-memory device, implementation of which will call for a reduced occupation of memory.

According to the present invention a method is provided for managing bad memory blocks in a nonvolatile-memory device, comprising a plurality of available memory blocks, each of which associated to a respective logic address, said management method comprising the steps of: dividing the available memory blocks into a first set and a second set, the first set being formed by addressable memory blocks that are to be used by a user, and the second set being formed by spare memory blocks reserved to the replacement of bad addressable memory blocks; each memory block assuming, in the respective set, a respective position; and re-mapping the bad addressable memory blocks in corresponding spare memory blocks; said step of re-mapping comprising the step of: constructing a data base containing, for each bad addressable memory block, information indicating the logic address of the corresponding spare memory block; said management method being characterized in that said step of creating a data base comprises the steps of: seeking bad spare memory blocks; storing the logic address of each bad spare memory block in a re-directing vector in a position corresponding to that of the bad spare memory block in the respective set; seeking bad addressable memory blocks; and storing the logic address of each bad addressable memory block in a free position in the re-directing vector.

Moreover, according to the present invention, there is provided a nonvolatile-memory device, comprising a plurality of memory blocks, and means for managing bad memory blocks, wherein said management means are configured in such a way as to implement a management method comprising the steps of: dividing the available memory blocks into a first set and a second set, the first set being formed by addressable memory blocks that are to be used by a user, and the second set being formed by spare memory blocks reserved to the replacement of bad addressable memory blocks; each memory block assuming, in the respective set, a respective position; and re-mapping the bad addressable memory blocks in corresponding spare memory blocks; said step of re-mapping comprising the step of: constructing a data base containing, for each bad addressable memory block, information indicating the logic address of the corresponding spare memory block; said step of creating a data base comprises the steps of: seeking bad spare memory blocks; storing the logic address of each bad spare memory block in a re-directing vector in a position corresponding to that of the bad spare memory block in the respective set; seeking bad addressable memory blocks; and storing the logic address of each bad addressable memory block in a free position in the re-directing vector.

BRIEF DESCRIPTION OF THE DRAWINGS

For a better understanding of the present invention, a preferred embodiment thereof is described hereinafter, purely as a non-limiting example, with reference to the attached drawings, wherein.

DETAILED DESCRIPTION

Figure 1:
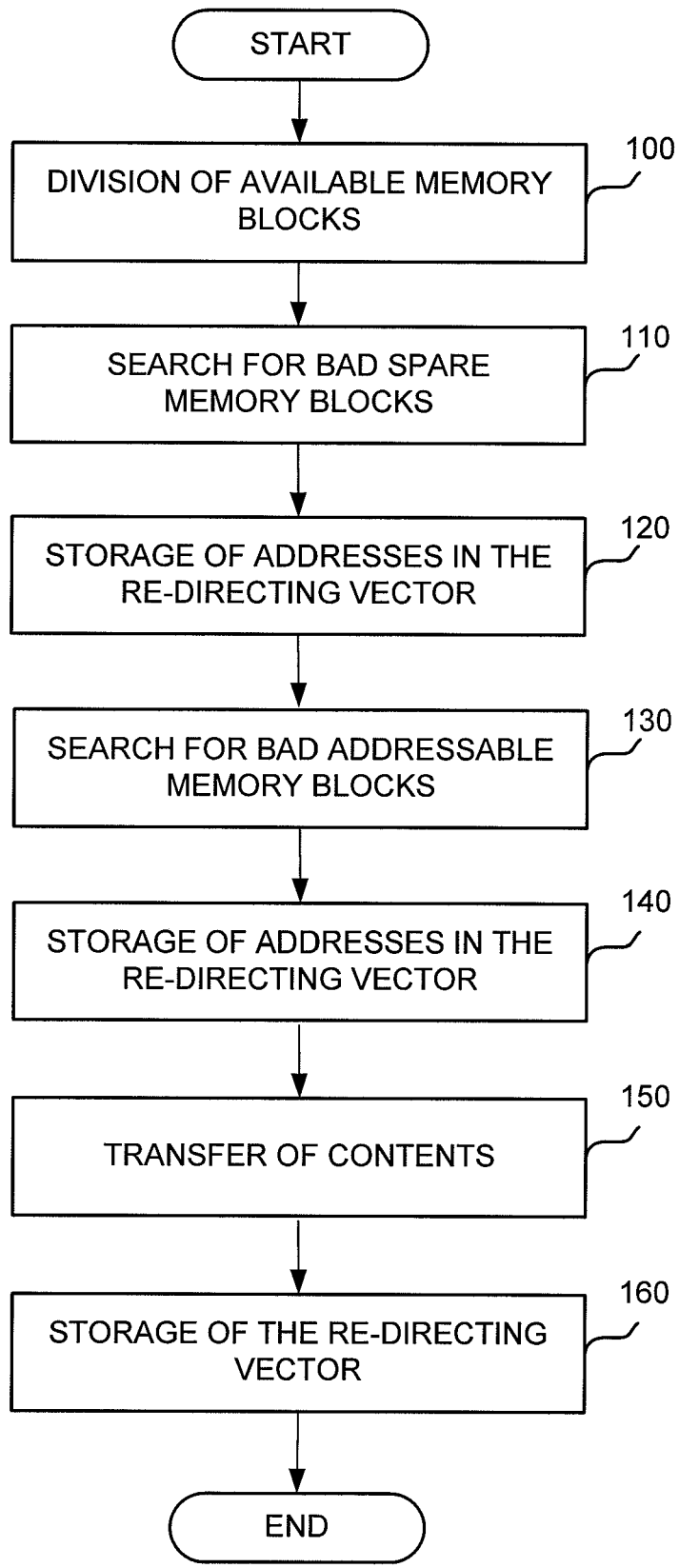
FIG. 1 shows a flowchart of the management of the re-mapping of bad memory blocks according to the present invention.
Figure 2:
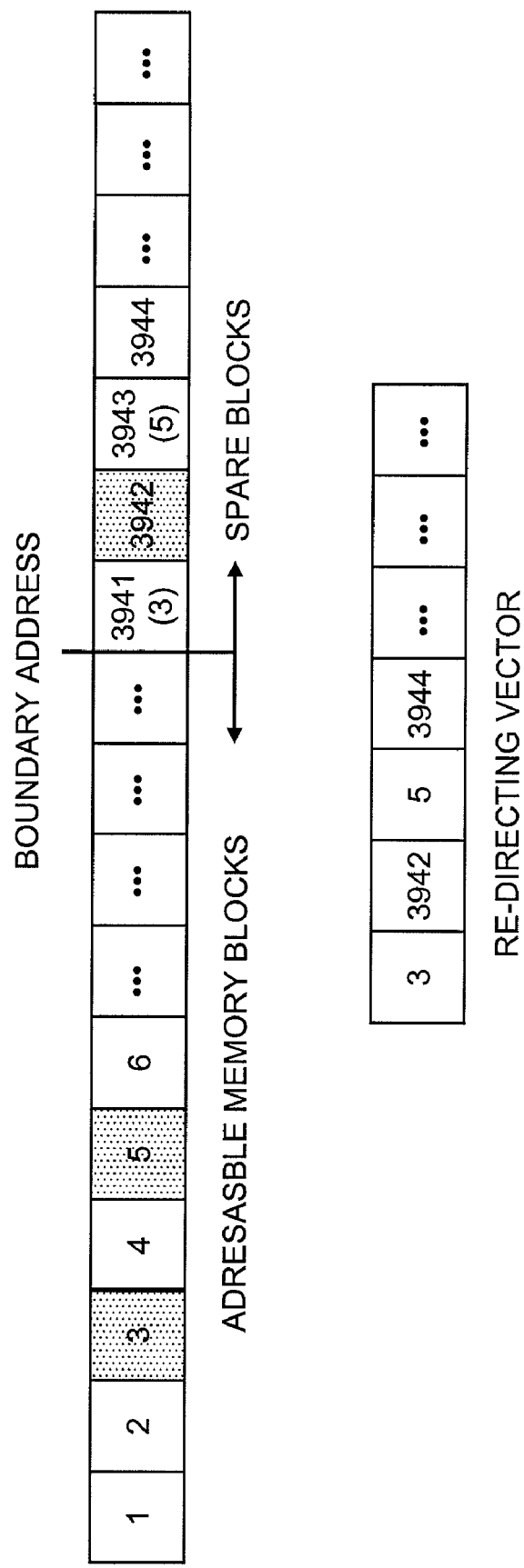
FIG. 2 is a schematic illustration of the memory blocks of a nonvolatile-memory device and a corresponding re-directing vector according to the invention.

FIG. 1 shows a flowchart of the re-mapping of bad memory blocks according to the present invention. To facilitate understanding of the present invention, the following description refers also to the example illustrated in FIG. 2, which is a schematic illustration of the memory blocks of a nonvolatile-memory device and the respective addresses, as well as a re-directing vector according to the present invention. In FIG. 2, moreover, the non-bad memory blocks are designated by a white background, whilst the bad memory blocks are designated by a dotted background.

As illustrated in FIG. 1, initially the available memory blocks are logically divided into two sets, one formed by memory blocks reserved to users, which, for simplicity, are referred hereinafter to as addressable memory blocks, and the other formed by memory blocks reserved to the replacement of bad addressable memory blocks, which are designated hereinafter, for simplicity, as "spare memory blocks" (block 100).

In particular, associated with the available memory blocks are respective logic addresses, which increase from a minimum value equal to one up to a maximum value equal to the total number of available memory blocks, which obviously depends upon the total storage capacity of the nonvolatile-memory device, and the aforementioned division is hence performed by calculating a boundary address between the two sets such that the number of spare memory blocks will satisfy the aforementioned specifications corresponding to the number of write and erase operations of the addressable memory blocks.

According to one embodiment, the boundary address is chosen so that the addressable memory blocks will have lower addresses than the boundary address, while the spare memory blocks will have addresses greater than or equal to the boundary address, i.e., so that the addressable memory blocks will have addresses increasing from a minimum address equal to one up to a maximum address equal to the boundary address less one, while the spare memory blocks will have addresses increasing from a minimum address equal to the boundary address up to a maximum address depending upon the overall storage capacity of the nonvolatile-memory device.

In this way, the memory blocks are arranged within the corresponding set according to an increasing logical order that defines their respective positions within the set; i.e., the memory blocks assume, within the corresponding set, logical positions increasing from a minimum value equal to one up to a maximum value equal to the number of memory blocks forming the set.

With reference once again to FIG. 1, after determining the boundary address, possible bad spare memory blocks are sought (block 110).

Generally, a memory block can become bad either during programming of any of the pages of the memory block or during erasing of the entire memory block, and is generally marked as such, simply by setting at a given value, which for design specifications is other than FF in hexadecimal, a given byte, typically the sixth, of the reserved area of a given page, typically the first or the second, of the memory block. The verification of the "badness" of a spare memory block is thus performed by simply verifying whether the sixth byte of the spare area of the first page or second page of the memory block is different from FF in hexadecimal.

In particular, the spare memory blocks are examined in an increasing way, i.e., starting from the one having an address equal to the boundary address up to the one having maximum address, and whenever a bad spare memory block is identified, its address is stored in a re-directing vector in the position corresponding to the one assumed by the bad spare memory block in the respective set (block 120). In mathematical terms, the address of the bad spare memory block is stored in the re-directing vector in the position corresponding to the offset that the address of the bad spare memory block has with respect to the boundary address, increased by one, i.e., in other words, corresponding to the difference between the address of the bad spare memory block and the boundary address, plus one.

The above is illustrated in the example of FIG. 2, where the bad spare memory blocks are the second, i.e., the one with address 3942, and the fourth, i.e., the one with address 3944, and their addresses are stored, respectively, in the second and in the fourth position of the re-directing vector, which correspond precisely to the positions assumed by the spare memory blocks in the respective set.

With reference once again to FIG. 1, once the search for the bad spare memory blocks is terminated, bad addressable memory blocks are then sought (block 130). The verification of the badness of an addressable memory block is performed similarly to what has been described above regarding to the spare memory blocks.

In particular, the addressable memory blocks are examined in an increasing way, starting from the one having an address equal to one up to the one having the address immediately preceding the boundary address, and whenever a bad addressable memory block is identified, its address is stored in a free position, i.e., one not occupied by the address of a bad spare memory block, of the re-directing vector (block 140).

Conveniently, storage of the addresses of the addressable memory blocks identified as being bad is performed starting from the lowest free positions up to the highest ones.

Each bad addressable memory block is thus re-mapped into a corresponding spare memory block having a position, in the corresponding set, corresponding to that of the address of the bad addressable memory block in the re-directing vector. In more precise terms, the bad addressable memory block is re-mapped into the spare memory block having an address equal to the sum of the boundary address and of the position of the address of the bad addressable memory block in the re-directing vector, plus one.

Should a bad memory block have an own content, re-mapping involves, in addition to re-directing, also the transfer of this content into the corresponding spare memory block (block 150).

The above is illustrated in the example of FIG. 2, where the bad addressable memory blocks are the third, i.e., the one with address 3, and the fifth, i.e., the one with address 5, and their addresses are stored in the first and, respectively, in the third position of the re-directing vector, which are precisely the first two free positions of the re-directing vector.

These bad memory blocks are thus re-mapped into the first spare memory block, i.e., the one with address 3491, and in the third spare memory block, i.e., the one with address 3493, the positions whereof in the respective set correspond precisely to the positions of their addresses in the re-directing vector.

With reference once again to FIG. 1, the re-directing vector thus constructed is finally stored in the storage device in one of the addressable memory blocks, for example in the last, i.e., the one having the address preceding the boundary address (block 160) in such a way as to enable it to be read whenever the user requests access to an addressable memory block.

Figure 3:
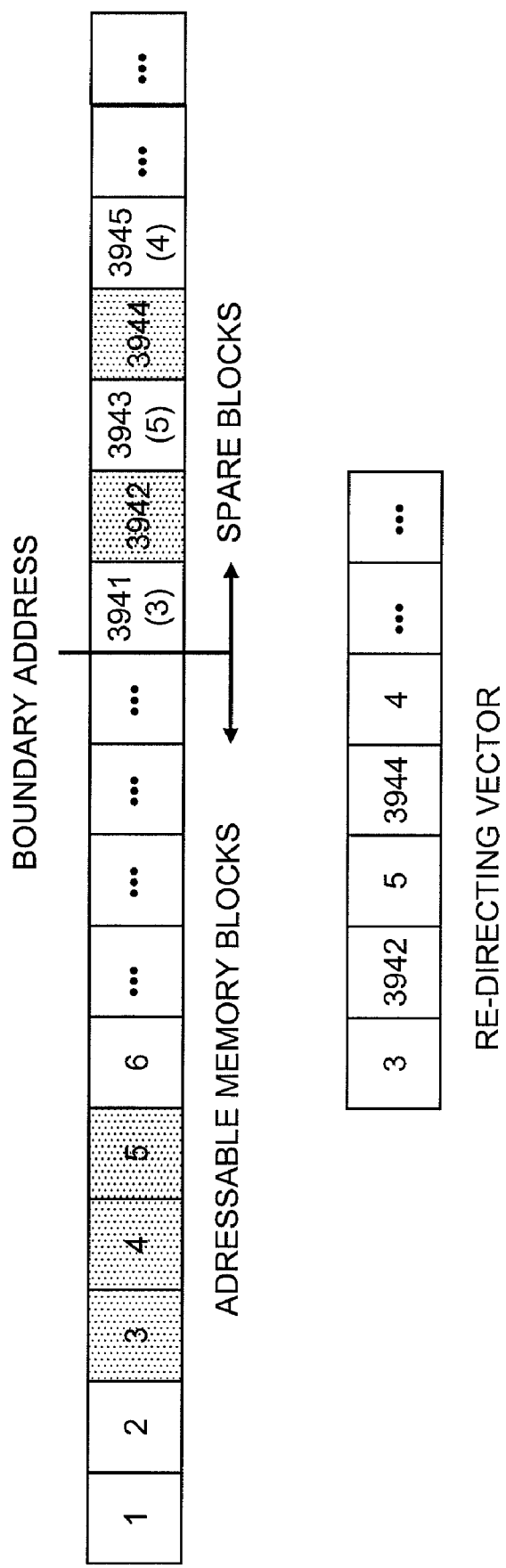
FIGS. 3 and 4 show how the re-directing vector of FIG. 1 is modified when a new memory block becomes bad during operation of the storage device.

FIG. 3 shows how the re-directing vector is modified when a new addressable memory block becomes bad during operation of the storage device, assuming as initial condition the one illustrated in FIG. 2.

In a way similar to the above, the address of the addressable memory block that has become bad, in the example considered the fourth, i.e., the one with address 4, is simply stored in the first free position of the re-directing vector, in the example considered the fifth position. In this way, then, the addressable memory block that has become bad is re-mapped into the corresponding spare memory block, the position whereof in the respective set corresponds to the position of the address of the new bad addressable memory block in the re-directing vector, in the example considered the fifth spare memory block, with address 3945.

Figure 4:
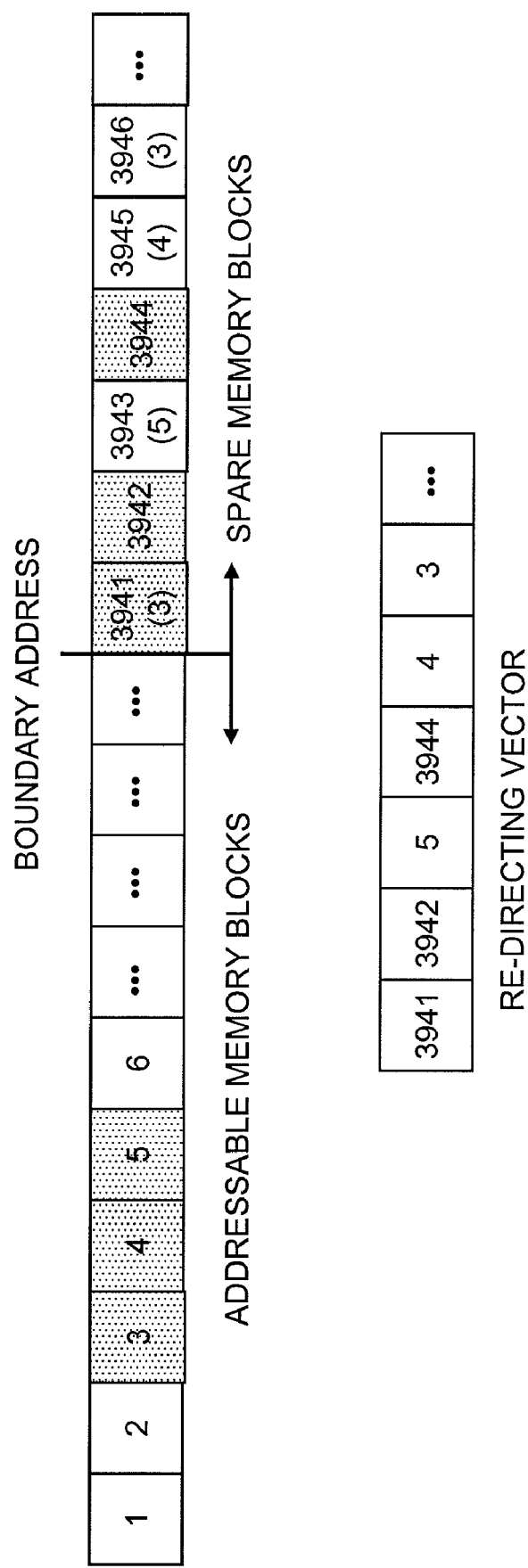

FIG. 4 shows, instead, how the re-directing vector is modified when it is a spare memory block, that becomes bad during operation of the storage device, assuming as initial condition the one illustrated in FIG. 3.

In a way similar to what the above, the address of the spare memory block that has become bad, in the example the first, i.e., the one with address 3941, is stored in the re-directing vector in the position corresponding to that of the spare memory block that has become bad in the corresponding set, in the example considered the first position. If in the re-directing vector this position is already occupied by the address of a bad addressable memory block, as in the example illustrated in FIG. 4, then this position is freed by displacing the address stored therein into the first free position of the re-directing vector, in the example considered the sixth position. The addressable memory block previously re-mapped into the bad spare memory block is thus re-mapped into the new spare memory block having, in the respective set, a position corresponding to the one into which the address of the bad addressable memory block has been shifted, in the example considered in the sixth spare memory block, i.e., the one with address 3946.

Storage of the addresses of the bad memory blocks in the re-directing vector performed in the way described above thus defines a strict biunique correspondence between the positions of the spare memory blocks, in which the bad addressable memory blocks are re-mapped, and the positions in which the addresses of the bad addressable memory blocks are stored within the re-directing vector.

The above biunique correspondence enables re-mapping of the bad memory blocks without having to store the addresses of the spare memory blocks in which the bad addressable memory blocks are re-mapped, but by constructing a simple one-dimensional re-directing vector the memory occupation whereof is approximately half that of the re-directing table according to the known art.

Figure 5:
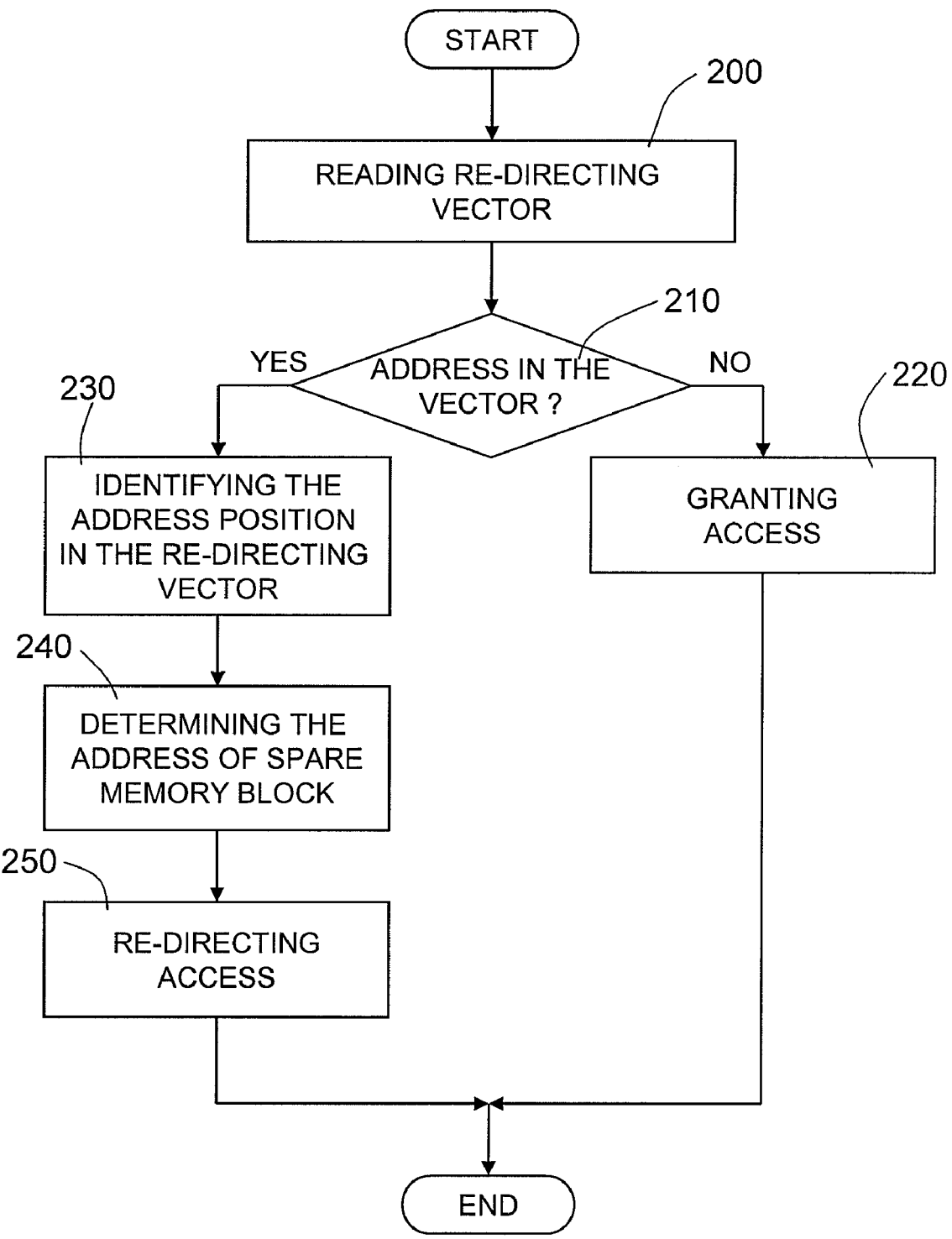
FIG. 5 shows a flowchart of the management of a request for access to a bad memory block.

Finally, FIG. 5 shows a flowchart corresponding to the management of a request for access to a bad addressable memory block.

According to FIG. 5, when a user requests access to an addressable memory block, for example to read or write data there, the stored re-directing vector is first read (block 200), then it is verified whether the address of this addressable memory block is contained in the re-directing vector (block 210).

If it is not (output NO from block 210), then access to this addressable memory block is granted (block 220); otherwise (output YES from block 210), the position within the re-directing vector in which its address has been stored is identified (block 230), the address of the spare memory block in which the bad addressable memory block has been re-mapped is determined (block 240), and finally access is re-directed to the spare memory block (block 250).

In particular, thanks to the biunique correspondence existing between the position, within the corresponding set, of the spare memory block in which the bad addressable memory block has been re-mapped and the position, within the re-directing vector, of the address of the bad addressable memory block, to determine the address of the spare memory block it is sufficient simply to sum up the boundary address and the position of the address of the bad addressable memory block in the re-directing vector, and decrease the result by one.

From an examination of the characteristics of the management method according to the present invention the advantages that it makes possible are evident.

In particular, via a simple re-directing vector constructed in the way described above it is possible to store which are the bad memory blocks, where these memory blocks are re-mapped and where a new bad memory block can be re-mapped. In particular, thanks to the biunique correspondence existing between the positions of the spare memory blocks in the respective set and the positions of the addresses of the bad addressable memory blocks in the re-directing vector, the re-mapping of the bad memory blocks is performed, without having to store the addresses of the spare memory blocks in which the bad memory blocks have been re-mapped, with a saving in terms of occupation of memory of approximately 50% with respect to the known art.

Furthermore, the function of search for the address of an addressable memory block within the re-directing vector can be performed via a simple ordered pointer, and rendered fast by the adoption of a hardware accelerator.

Finally, it is clear that modifications and variations can be made to the method described and illustrated herein, without thereby departing from the scope of protection of the present invention, as defined in the annexed claims.

In particular, the division of the available memory blocks into spare memory blocks and addressable memory blocks could be performed in a different way from the one described. For example, the spare memory blocks could be the ones having addresses smaller than or equal to the boundary address and the addressable memory blocks could be the ones having addresses greater than the boundary address, or else the spare memory blocks could be the ones having addresses comprised between a lower boundary address and a higher boundary address.

Furthermore, the memory blocks could be arranged within the respective sets according to different orders from what has been described; for example, they could be arranged in decreasing order or else according to any other logical order that in any case defines one of its logical positions within the set.

Finally, the criterion with which the addresses of the bad addressable memory blocks are stored in the re-directing vector could be different from what has been described, for example the reverse, i.e., the addresses could be stored starting from the highest free positions down to the lowest.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A method for managing bad memory blocks in a nonvolatile-memory device, said nonvolatile-memory device comprising a plurality of available memory blocks each of which is associated with a respective logic address, said management method comprising steps of:
   dividing the available memory blocks into a first set and a second set, the first set being formed by addressable memory blocks that are to be used by a user, and the second set being formed by spare memory blocks reserved for replacement of bad addressable memory blocks, each memory block assuming, in a respective set, a respective position; and
   re-mapping the bad addressable memory blocks in corresponding spare memory blocks, said step of re-mapping comprising a step of:
      constructing a data base containing, for each bad addressable memory block, information indicating a logic address of a corresponding spare memory block, said step of constructing the data base comprises steps of:
      seeking bad spare memory blocks;
         storing a logic address of each bad spare memory block in a re-directing vector in a position corresponding to that of the bad spare memory block in the second set;
      seeking bad addressable memory blocks; and
         storing a logic address of each bad addressable memory block in a free position in the re-directing vector.

2. The management method according to claim 1, further comprising steps of:
   detecting a request for access to an addressable memory block;
   verifying whether a logic address of said addressable memory block is contained in the re-directing vector;
   if the logic address of the addressable memory block is not contained in the re-directing vector, enabling access to said addressable memory block; and
   if the logic address of the addressable memory block is contained in the re-directing vector, reading a position of its address in the re-directing vector, and re-directing the access to a spare memory block, which has, in the second set, a position corresponding to that of the logic address of the addressable memory block in the re-directing vector.

3. The management method according to claim 1, wherein the step of storing the logic address of a bad spare memory block in the re-directing vector in a position corresponding to that of the bad spare memory block in the second set comprises steps of:
   verifying whether in the re-directing vector said position is already occupied by a logic address of a bad addressable memory block;
   if said position is free, storing the logic address of the bad spare memory block in said free position; and
   if said position is occupied by the logic address of the bad addressable memory block, shifting said logic address of the bad addressable memory block into a free position in the re-directing vector, and storing the logic address of the bad spare memory block in the position thus freed.

4. The management method according claim 1, for a nonvolatile-memory device wherein each available memory block is divided into a plurality of pages, each page from the plurality of pages being formed by a plurality of bytes, wherein the step of seeking bad spare memory blocks and the step of seeking bad addressable memory blocks each comprise verifying whether a specific byte of a specific page of the available memory block assumes a value different from a given reference value.

5. The management method according to claim 1, in which logic addresses of the bad addressable memory blocks are stored in the re-directing vector starting from lowest positions.

6. A nonvolatile-memory device comprising a plurality of memory blocks each of which is associated with a respective logic address, and means for managing bad memory blocks, wherein said means are configured in such a way as to implement a management method comprising the steps of:
   dividing the memory blocks into a first set and a second set, the first set being formed by addressable memory blocks that are to be used by a user, and the second set being formed by spare memory blocks reserved for replacement of bad addressable memory blocks, each memory block assuming, in a respective set, a respective position; and
   re-mapping the bad addressable memory blocks in corresponding spare memory blocks; said step of re-mapping comprising a step of:
      constructing a data base containing, for each bad addressable memory block, information indicating a logic address of a corresponding spare memory block, said step of constructing a data base comprises steps of:
      seeking bad spare memory blocks;
         storing a logic address of each bad spare memory block in a re-directing vector in a position corresponding to that of the bad spare memory block in the respective set;
      seeking bad addressable memory blocks; and storing a logic address of each bad addressable memory block in a free position in the re-directing vector.

7. The nonvolatile-memory device of claim 6, wherein storing the logic address of a bad addressable memory block in the free position in the re-directing vector comprises storing the logic address of the bad addressable memory block in a lowest free position.

8. A method for managing memory blocks in nonvolatile memory, the nonvolatile memory comprising a plurality of memory blocks, each of the blocks is associated with a logic address, the method comprising:
dividing the memory blocks into a first set comprising a plurality of addressable memory blocks and a second set comprising a plurality of spare memory blocks reserved for replacement of bad addressable memory blocks from the plurality of addressable memory blocks; and
re-mapping at least one bad addressable memory block into a spare memory block from the plurality of spare memory blocks, wherein a logic address of the spare memory block in the second set corresponds to a position of an address of the at least one bad addressable memory block in a re-directing vector.

9. The method of claim 8, wherein the logic address of the spare memory block in the second set equals to a sum of an address boundary between the first set and a second set and the position of the address of the at least one bad addressable memory block in a re-directing vector.

10. The method of claim 8, comprising
searching for a bad spare memory block among the plurality of the spare memory blocks;
storing a logic address of each bad spare memory block in the re-directing vector in a position corresponding to a position of the bad spare memory block in the second set;
searching for a bad addressable memory block among the plurality of the addressable memory blocks; and
storing a logic address of each bad addressable memory block in a free position in the re-directing vector.

11. The method of claim 8, further comprising
storing a logic address of an addressable memory block that has become bad in a next free position in the re-directing vector; and
remapping the addressable memory block into a spare memory block, wherein a position of the spare memory block corresponds to a position of the logic address of the addressable memory block in the re-directing vector.

12. The method of claim 8, further comprising, when storing a logic address of a spare memory block that has become bad,
determining whether in the re-directing vector a position corresponding to a position of the bad spare memory block in the second set is occupied by a logic address of a bad addressable memory block;
when the position in the re-directing vector is free, storing the logic address of the bad spare memory block in the position in the re-directing vector; and
when the position is occupied by the logic address of the bad addressable memory block, shifting the logic address of the bad addressable memory block into a free position in the re-directing vector to free the position in the re-directing vector, and storing the logic address of the spare memory block in the position in the re-directing vector.

13. The method of claim 8, further comprising
detecting a request for access to an addressable memory block; and
determining whether the addressable memory block has been re-mapped into the second set.

14. The method of claim 13, comprising
determining whether the re-directing vector contains a logic address of the addressable memory block;
when the re-directing vector does not contain the logic address of the addressable memory block, enabling the access to the addressable memory block; and
when the re-directing vector contains the logic address of the addressable memory block,
obtaining a position of the logic address in the re-directing vector, and
re-directing the access to a spare memory block that is at a position in the second set corresponding to the position of the logic address of the addressable memory block in the re-directing vector.

15. The method of claim 8, wherein each memory block is divided into a plurality of pages with each page from the plurality of pages comprising a plurality of bytes, the method further comprising
determining whether the memory block is bad by determining whether a specific byte of a specific page of the memory block has a value different from a reference value.

16. A nonvolatile-memory device comprising a plurality of memory blocks with each memory block from plurality of memory blocks associated with a logic address, and means for managing bad memory blocks from plurality of memory blocks, wherein the means are configured to implement a method comprising
dividing the plurality of memory blocks into a first set comprising a plurality of addressable memory blocks and a second set comprising a plurality of spare memory blocks;
re-mapping at least one bad addressable memory block into a spare memory block from the plurality of spare memory blocks, wherein a logic address of the spare memory block in the second set corresponds to a position of an address of the at least one bad addressable memory block in a re-directing vector.

17. The nonvolatile-memory device of claim 16, wherein the method comprises
storing a logic address of each bad spare memory block in the re-directing vector in a position corresponding to a position of the bad spare memory block in the second set; and
storing a logic address of each bad addressable memory block in a free position in the re-directing vector.

18. The nonvolatile-memory device of claim 16, wherein the method further comprises
storing a logic address of an addressable memory block that has become bad in a next free position in the re-directing vector; and
remapping the addressable memory block into a spare memory block, wherein a position of the spare memory block corresponds to a position of the logic address of the addressable memory block in the re-directing vector.

19. The nonvolatile-memory device of claim 16, wherein the method further comprises, when storing a logic address of a spare memory block that has become bad,
determining whether in the re-directing vector a position corresponding to a position of the bad spare memory block in the second set is occupied by a logic address of a bad addressable memory block;
when the position in the re-directing vector is free, storing the logic address of the bad spare memory block in the position in the re-directing vector; and when the position is occupied by the logic address of the bad addressable memory block, shifting the logic address of the bad addressable memory block into a free position in the re-directing vector to free the position in the re-directing vector, and storing the logic address of the spare memory block in the position in the re-directing vector.

20. The nonvolatile-memory device of claim 16, wherein the method further comprises detecting a request for access to an addressable memory block;

determining whether the re-directing vector contains a logic address of the addressable memory block;

when the re-directing vector does not contain the logic address of the addressable memory block, enabling the access to the addressable memory block; and when the re-directing vector contains the logic address of the addressable memory block, obtaining a position of the logic address in the re-directing vector, and re-directing the access to a spare memory block that is at a position in the second set corresponding to the position of the logic address of the addressable memory block in the re-directing vector.

\* \* \* \* \*